United States Patent
Voronin et al.

(10) Patent No.: US 9,966,312 B2
(45) Date of Patent: May 8, 2018

(54) METHOD FOR ETCHING A SILICON-CONTAINING SUBSTRATE

(71) Applicant: Tokyo Electron Limited, Minato-ku, Tokyo (JP)

(72) Inventors: Sergey Voronin, Delmar, NY (US); Alok Ranjan, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/243,476

(22) Filed: Aug. 22, 2016

(65) Prior Publication Data
US 2017/0062225 A1    Mar. 2, 2017

Related U.S. Application Data

(60) Provisional application No. 62/209,662, filed on Aug. 25, 2015.

(51) Int. Cl.
*H01L 21/302* (2006.01)
*H01L 21/461* (2006.01)
*H01L 21/336* (2006.01)
*H01L 21/331* (2006.01)
*B44C 1/22* (2006.01)
*C03C 15/00* (2006.01)
(Continued)

(52) U.S. Cl.
CPC .. *H01L 21/823431* (2013.01); *C11D 11/0041* (2013.01); *H01L 21/02041* (2013.01); *H01L 21/02301* (2013.01); *H01L 21/02334* (2013.01); *H01L 21/3065* (2013.01); *H01L 21/32136* (2013.01); *H01L 21/74* (2013.01)

(58) Field of Classification Search
None
See application file for complete search history.

(56) References Cited

U.S. PATENT DOCUMENTS 6,322,714 B1 * 11/2001 Nallan .............. H01L 21/02071
                                                                    134/1.2
8,778,206 B2    7/2014 Nishimura et al.
(Continued)

FOREIGN PATENT DOCUMENTS

| TW | 552671 B | 9/2003 |
|----|----------|--------|
| TW | 201248719 A | 12/2012 |
| WO | 2013/008878 | * 1/2013 |

OTHER PUBLICATIONS

Wongwanitwattana et al, Precision plasma etching fo Si, Ge, and Ge:P by SF6 with added O2, Mar. 2014, J. Vac. Sci. Technol., 32, 031302-1-031202-5.*
(Continued)

*Primary Examiner* — Stephanie P Duclair
(74) *Attorney, Agent, or Firm* — Wood Herron & Evans LLP

(57) ABSTRACT

Techniques herein provide a chamber and substrate cleaning solution for etching and removing byproducts between separate etching steps. Such techniques include using a cleaning step based on fluorine chemistry, which is executed in between separate etch steps or divided etch steps. Such a technique can be executed in situ for improved efficiency. Other benefits include increasing etching depth/aspect ratios, and preventing post-etching defects including physical contact with neighboring gates, etc. Techniques herein are especially beneficial when applied to relatively small feature openings.

18 Claims, 3 Drawing Sheets

(51) Int. Cl.
*C03C 25/68* (2006.01)
*G01L 21/30* (2006.01)
*C23F 1/00* (2006.01)
*H01L 21/8234* (2006.01)
*H01L 21/3213* (2006.01)
*H01L 21/02* (2006.01)
*C11D 11/00* (2006.01)
*H01L 21/3065* (2006.01)
*H01L 21/74* (2006.01)

(56) References Cited

U.S. PATENT DOCUMENTS

2004/0033697 A1* 2/2004 Kumar .............. H01J 37/32082
   438/710
2006/0172546 A1 8/2006 Iijima et al.
2008/0286978 A1* 11/2008 Chen ................ H01L 21/30655
   438/713
2013/0164911 A1* 6/2013 Ito ..................... H01L 21/76229
   438/435
2014/0308815 A1* 10/2014 Dokan ................ H01L 21/0206
   438/714

OTHER PUBLICATIONS

Taiwan Intellectual Property Office, Notification of Examination Opinion issued in counterpart Taiwan Application No. 105127176 dated May 1, 2017, 22 pp., including English translation.
Taiwan Intellectual Property Office, Notice of Allowance issued in counterpart Taiwan Application No. 105127176 dated Aug. 9, 2017, 3 pp., including English translation.

* cited by examiner

METHOD FOR ETCHING A SILICON-CONTAINING SUBSTRATE

CROSS REFERENCE TO RELATED APPLICATIONS

The present application claims the benefit of U.S. Provisional Patent Application No. 62/209,662, filed on Aug. 25, 2015, entitled "Method for Etching a Silicon-Containing Substrate," which is incorporated herein by reference in its entirety.

BACKGROUND OF THE INVENTION

This relates to semiconductor fabrication including etching of substrates such as wafers.

Fabrication of integrated circuits (IC) in the semiconductor industry typically employs plasma processing to create and assist surface chemistry necessary to remove material from and deposit material to a substrate within a plasma processing chamber. Examples of plasma processing apparatus include a plasma CVD (Chemical Vapor Deposition) apparatus configured to deposit a thin film on a substrate, and a plasma etching apparatus configured to remove material from a substrate, which can include using an etch mask to define locations for removing material. In general, such plasma processing apparatus form plasma under vacuum conditions by flowing a process gas into a processing chamber and heating electrons to energies sufficient to sustain ionizing collisions. Moreover, the heated electrons can have energy sufficient to sustain dissociative collisions and, therefore, a specific set of gases under predetermined conditions (e.g., chamber pressure, gas flow rate, etc.) are chosen to produce a population of charged species and/or chemically reactive species suitable to a particular process being performed within the chamber (e.g., etching processes where materials are removed from the substrate or deposition processes where materials are added to the substrate).

SUMMARY

Selective etching of silicon is typically executed by using dry, plasma-based etching in which hydrogen bromide (HBr) is used as an etchant gas (among other gases) in a particular process gas or process gas mixture. During etching of silicon, oxygen is typically present in the chamber. Reacting with the oxygen during silicon etchings, HBr generates significant amounts of a non-volatile byproduct in form of $Si_xBr_yO_z$ or $Si_xBr_y$. This bromine-containing byproduct accumulates on chamber walls of a plasma processing chamber used for etching. The accumulated byproduct then desorbs to the gas phase and re-deposits on a substrate being processed or etched. This re-deposition can result in clogging of narrow features, etch profile distortion and limited etching depth at high aspect ratios.

Techniques herein, however, provide a chamber and substrate cleaning solution for etching and removing byproducts between separate etching steps. Such techniques include using a cleaning step based on fluorine chemistry, which is executed in between separate etch steps or divided etch steps. Such a technique can be executed in situ for improved efficiency. Other benefits include increasing etching depth/aspect ratios, and preventing post-etching defects including physical contact with neighboring gates, etc.

Of course, the order of discussion of the different steps as described herein has been presented for clarity sake. In general, these steps can be performed in any suitable order.

Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Aspect ratio dependent etching limits sub-10 nm scale process performance. For example, one limitation for etching structures at smaller nodes is due to physical blockage of targeted features during etching to transfer a mask pattern. As aspect ratios increase and critical dimensions shrink it becomes more difficult to etch features as specified or as designed.

Selective etching of silicon is typically executed by using dry, plasma-based etching in which hydrogen bromide (HBr) is used as an etchant gas among other gases in a particular process gas. During etching of silicon, oxygen is typically present in the chamber. Reacting with the oxygen during silicon etching, HBr generates significant amounts of a non-volatile byproduct in form of $Si_xBr_yO_z$ or $Si_xBr_y$. This bromine-containing byproduct accumulates on chamber walls of a plasma processing chamber used for etching. The accumulated byproduct then desorbs to the gas phase and re-deposits on a substrate being processed or etched. This re-deposition can result in clogging of narrow features, etch profile distortion and limited etching depth at high aspect ratios.

Figure 1:
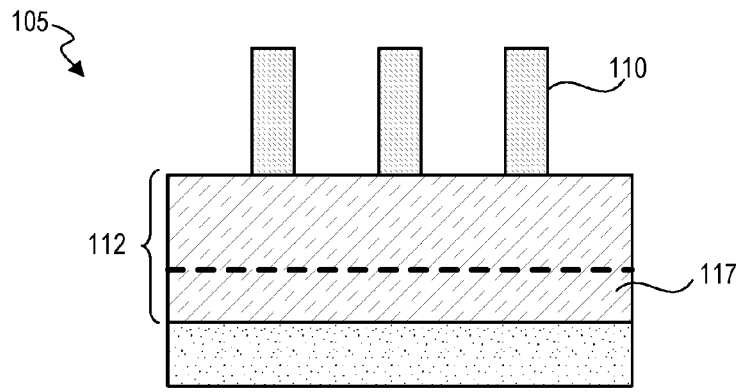
FIG. 1 is a cross-sectional schematic views of an example substrate segment to be processed.

FIG. 1 shows an example substrate segment 105 to be etched. This substrate segment includes a hardmask 110 that is a relief pattern used to mask etchants during a pattern transfer step. The hardmask 110 is positioned on a silicon layer 112. The silicon layer 112 can include one or more buried structures, such as a fin 117 of a FinFET device. An etch process is commenced that uses a bromine-containing or chlorine-containing process gas fed into an etch chamber within which the substrate is positioned. A directional etching process then etches a first portion of the silicon layer according to a pattern defined by the hardmask 110.

Figure 2:
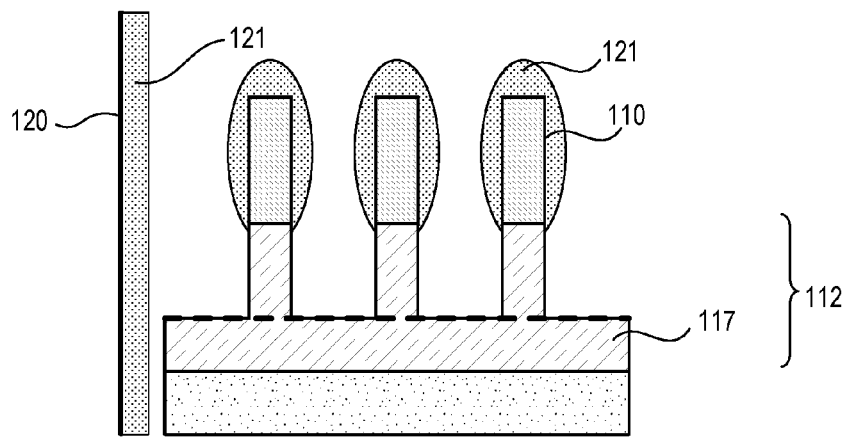
FIG. 2 is a cross-sectional schematic views of an example substrate segment showing accumulated byproduct.

FIG. 2 shows results of etching a first portion of the silicon layer 112. Note that a bromine-containing (or chlorine-containing) byproduct 121 is deposited on chamber walls 120 and on the hardmask 110 and structures being etched. Re-deposition of byproduct 121 is typically isotropic, and thus more byproduct material accumulates on top surfaces of the substrate, which in this scheme includes top portions of the hardmask. Some fabrication techniques use a two-part etch process, especially when uncovering buried structures. An example application for this two-part etch process is executing a first etch process to uncover material above top surfaces of the buried structures, and then executing a second etch process that clears material from around the now uncovered structures.

The first etch process to remove silicon material in a given substrate until reaching a predetermined depth or until uncovering buried structures is often referred to as a "main etch." After uncovering any buried features, these features may need to have material surrounding these features removed. Removing the surrounding material is often referred to as an "over etch" because uncovered structures and floor surfaces will be exposed to potentially damaging etchants while remaining material is removed.

With the first etch process, a relatively more aggressive or relatively less selective etch process can optionally be used. For the second etch process, it is advantageous to use an etch chemistry with a high selectivity to material of the uncovered structures and to floor material because these materials will be exposed to etchants for a relatively long duration as etchants work to remove surrounding material. Unfortunately, such over etch steps can increase byproduct re-deposition on the substrate. Note that there may already be some byproduct release from chamber walls and re-deposition on the substrate even without using different etch parameters as compared to etch parameters used for the main etch. In other words, even using highly selective chemistries for both etching steps, there will be byproduct creation and re-deposition, which is problematic at smaller critical dimensions.

Figure 3:
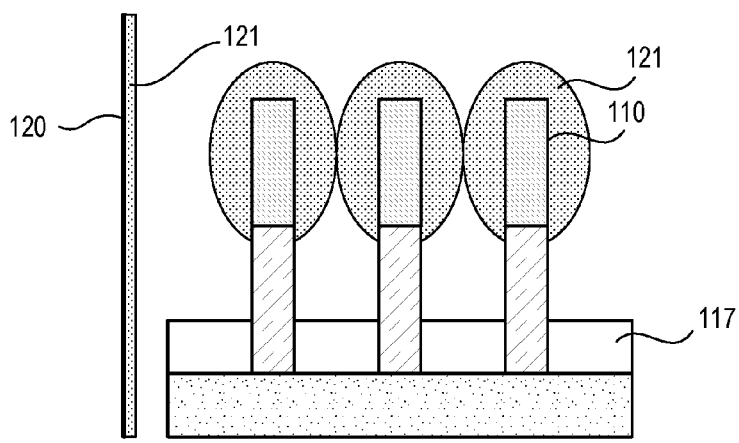
FIG. 3 is a cross-sectional schematic views of an example substrate segment showing accumulated byproduct.

As noted above, with decreasing feature size, such as at the 10 nanometer node and below, the byproduct re-deposition can be sufficient to partially or fully block an over etch operation as byproduct accumulates on the substrate surface, typically at top portions of the mask layer. FIG. 3 illustrates byproduct re-deposition bridging between two adjacent structures of the hardmask 110 to block a path of directional etchants. In a more specific example, as silicon is etched from the substrate, silicon can combine with bromine or combine with bromine and oxygen and then deposit on chamber walls after formation. This bromine-containing byproduct that accumulated on chamber walls then desorbs to a gas phase and re-deposits itself on a substrate being processed as shown below. This re-deposition can result in clogging of relatively narrow features, etch profile distortion, limited etching depth at high aspect ratios, and even full etch stop.

Techniques herein, however, provide a chamber and substrate cleaning solution for etching and removing byproducts between separate etching steps. Such techniques include using a cleaning step based on fluorine chemistry and executed in between separate etch steps—all of which can be executed in situ for improved efficiency. Other benefits include increasing etching depth/aspect ratios, and preventing post-etching defects including physical contact with neighboring gates, etc.

Introducing an in situ chamber cleaning step, herein, between separate etch steps can remove or reduce SiBrO byproducts. There are various fluorine-containing gases that can be used. For example, $CF_4$ can be selected for use. When energized, $CF_4$ breaks down in one or more forms releasing one or more atomic fluorine ions. Atomic fluorine can then react with $Si_xBr_yO_z$ (solid) to form SiF, which is a gas that can be pumped out of a corresponding plasma processing chamber. Moreover, atomic fluorine does not damage structures such as fins covered by bulk silicon. Note that a small portion of byproduct accumulated during the over etch step can result in re-deposition onto the substrate, but this re-deposition is not significant for preventing or obstructing the over etch step.

One embodiment includes a method for processing a substrate, such as within a plasma processing system. Plasma processing systems are well known in semiconductor fabrication. Such systems typically include a chamber that can be vacuum sealed, a substrate holder for holding a substrate such as a wafer, a gas delivery system for flowing gasses into the chamber, and one or more power systems to energize process gas to create plasma. The substrate holder can be connected to a power source to provide an electrical bias that directionally draws ions toward the substrate. An exhaust system removes volatile particles from the processing chamber.

Figure 4:
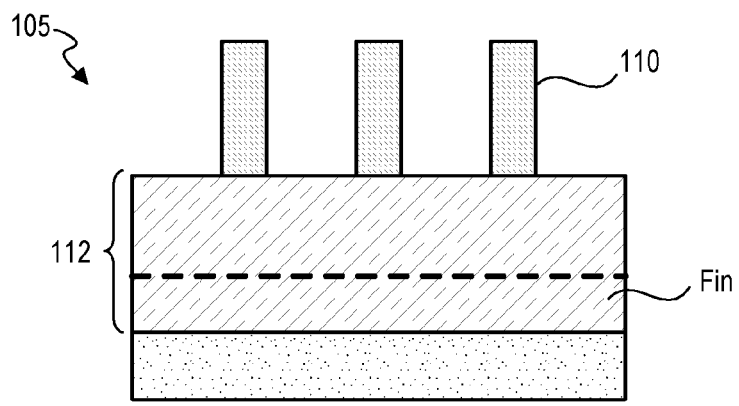
FIG. 4 is a cross-sectional schematic views of an example substrate segment showing a process flow according to embodiments disclosed herein.

A substrate is positioned in a chamber of the plasma processing system. The substrate has a masking layer positioned over a silicon-containing layer or over a germanium-containing layer. The masking layer defines openings less than 40 nanometers. In other words, contact openings or trenches of the masking layer can be less than 40 nanometers in width. FIG. 4 illustrates an example substrate segment.

Figure 5:
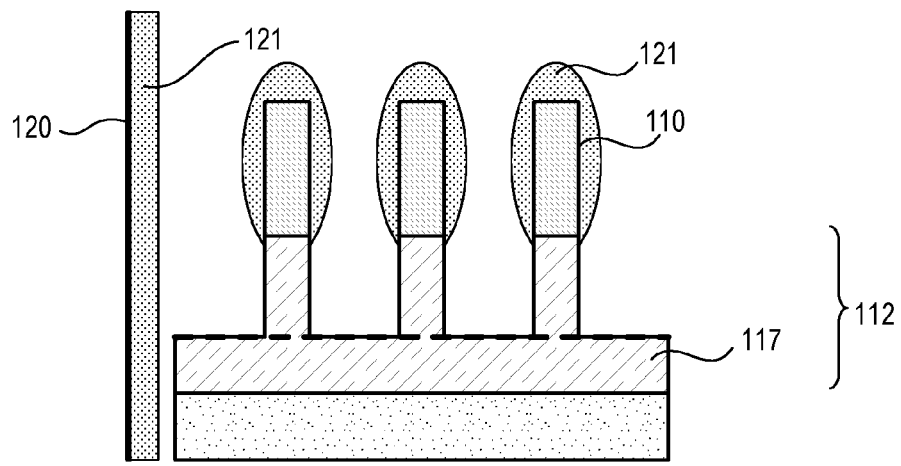
FIG. 5 is a cross-sectional schematic views of an example substrate segment showing a process flow according to embodiments disclosed herein.

A first etching process is executed that anisotropically etches a first portion of the silicon-containing layer using the masking layer as an etch mask. This first etching process uses a plasma formed from a first process gas that includes a bromine-containing gas or a chlorine-containing process gas. Note that this first etching process can include multiple sub-processes, which are essentially adjustments of process parameters (varying gas ratios, pressures, included gases, et cetera). Prior to the first etching process, a "breakthrough" etch can initially be performed to remove any native oxide and/or silicon on top of the masking layer as needed. During the one or more first etching processes, various pressures can be used. For example, pressure can be adjusted between 5 millitorr and 50 millitorr or more or less. Other process gasses can be included in the first process gas delivered to the plasma processing chamber. These gasses can include oxygen, diluent gases and noble gasses, such as argon, among others. Various ratios of HBr can be used depending on particular etch objectives or fabrication specifications. FIG. 5 shows an example result.

Figure 6:
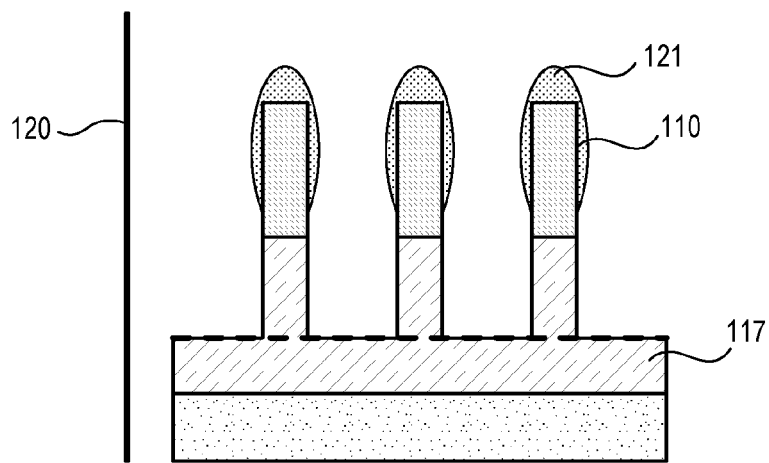
FIG. 6 is a cross-sectional schematic views of an example substrate segment showing a process flow according to embodiments disclosed herein.

After the first etching process is completed, a chamber cleaning step is executed that includes removing chamber wall residue using plasma formed from a second process gas that includes a fluorine-containing process gas. Chamber wall residue can include products from the first etching process. The chamber cleaning step is executed while the substrate is positioned in the chamber of the plasma processing system. Removing chamber wall residue can include removing $Si_xBr_yO_z$, wherein x and y are non-zero (greater than zero), though z can be zero or greater. Note that in some embodiments the first etching process can be completed prior to flowing the second process gas. In other embodiments, the second process gas (gas mixture) can be introduced at the end of the first etching process, after which flow of the process gas is shut off. Thus, there can be an overlap or a complete stop between the first etching process and the chamber cleaning step. The chamber cleaning step can be executed as an isotropic etch so that atomic fluorine can contact byproducts on chamber walls. FIG. 6 shows an example result.

Figure 7:
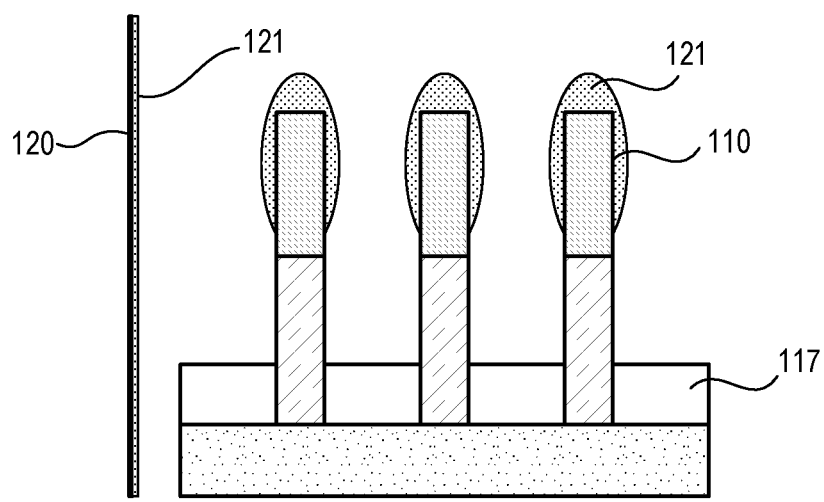
FIG. 7 is a cross-sectional schematic views of an example substrate segment showing a process flow according to embodiments disclosed herein.

A second etching process is executed that anisotropically etches a second portion of the silicon-containing layer using the masking layer as an etch mask, and using plasma formed from a third process gas (process gas mixture) that includes a bromine-containing gas or a chlorine-containing gas. The first etching process and the second etching process create a space or defined opening (such as a trench or hole) in the substrate having an aspect ratio value greater than 7.0 as calculated from a top of the masking layer to a bottom of the second portion of the silicon-containing layer. By way of a non-limiting example, this aspect ratio can be measured from a top of the hardmask to a bottom of fin structures. The FIG. 7 illustrates an example result.

In other embodiments, executing the first etching process that anisotropically etches the first portion of the silicon-containing layer can include etching the silicon-containing layer until reaching one or more buried structures within the silicon-containing layer. Moreover, the one or more buried structures within the silicon-containing layer can include a fin of a FinFET structure, which is a fin structure of a field effect transistor. Executing the second etching process that anisotropically etches the second portion of the silicon-containing layer can include etching a remaining portion of the silicon-containing layer until silicon-containing layer material is removed from around the fin structure of the FinFET device. In other words, silicon material is cleaned from around the fins.

In other embodiments, the second process gas can include an oxygen-containing gas. Executing the chamber cleaning step can include forming an oxide layer on exposed vertical surfaces of the silicon-containing layer having been exposed from the first etching process. This can be beneficial to prevent bowing of silicon sidewalls created from the first etching process. Depending on etch parameters and substrate configuration, products from the fluorine-based plasma can remove silicon material along sidewalls of etched structures. A cross-sectional view can show bowing or a curving in of the sidewalls. This is undesirable as such bowing can weaken structures and lead to pattern collapse and device failure. Adding oxygen to the second process gas, however, can result in an oxide layer being formed on exposed sidewalls. This oxide layer protects silicon sidewalls during the cleaning process. Embodiments can include controlling critical dimensions of features being etched by controlling a carbon-to-fluorine ratio during the chamber cleaning step. Adding oxygen to the second process gas, thereby modifying the carbon-to-fluorine ratio can function to reduce bowing for improved profile. When $CF_4$ reacts with $O_2$ there is more free fluorine because carbon atoms can be consumed by $O_2$ or react with oxygen. With more fluorine there is more polymer destroyed which means more efficient cleaning.

In some embodiments, the chamber cleaning step is executed after completion of the first etching process, and the second etching process is executed after completion of the chamber cleaning step. In other embodiments there can be overlap of the different processes. In some embodiments, executing the second etching process includes maintaining plasma at a greater plasma pressure as compared to the first etching process. In other embodiments, plasma pressure of the second etching process can be similar to plasma pressures of the first etching process. In some embodiments, the steps of executing the first etching process, executing the chamber cleaning step, and executing the second etching process can be cycled until a predetermined depth of the silicon-containing layer has been etched. After completing the etching, cleaning and second etching steps, further processing can be continued on the substrate, such as a wet clean to remove the hardmask.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for processing a substrate, the method comprising:

positioning the substrate in a chamber of a plasma processing system, the substrate having a masking layer positioned over a silicon-containing layer, the masking layer defining openings less than 40 nanometers;

executing a first etching process that anisotropically etches a first portion of the silicon-containing layer until reaching one or more buried structures within the silicon-containing layer using the masking layer as an etch mask and using plasma formed from a first process gas that includes a bromine-containing gas or a chlorine-containing process gas;

executing a chamber cleaning step that includes removing chamber wall residue using plasma formed from a second process gas that includes a fluorine-containing process gas, the chamber wall residue including products from the first etching process, the chamber cleaning step being executed while the substrate is positioned in the chamber of the plasma processing system; and executing a second etching process that anisotropically etches a second portion of the silicon-containing layer using the masking layer as the etch mask and using plasma formed from a third process gas that includes the bromine-containing gas or the chlorine-containing gas, wherein the first etching process and the second etching process create a space in the substrate having an aspect ratio value greater than 7.0 as calculated from a top of the masking layer to a bottom of the second portion of the silicon-containing layer.

2. The method of claim 1, wherein the one or more buried structures within the silicon-containing layer includes a fin of a FinFET structure.

3. The method of claim 2, wherein executing the second etching process that anisotropically etches the second portion of the silicon-containing layer includes etching a remaining portion of the silicon-containing layer until the remaining portion of the silicon-containing layer is removed from around the fin of the FinFET structure.

4. The method of claim 1, wherein executing the chamber cleaning step includes using the second process gas that includes an oxygen-containing gas.

5. The method of claim 4, wherein executing the chamber cleaning step includes forming an oxide layer on exposed vertical surfaces of the silicon-containing layer having been exposed from the first etching process.

6. The method of claim of claim 1, wherein removing the chamber wall residue includes removing $Si_xBr_yO_z$ or $Si_xCl_yO_z$, wherein x and y are non-zero.

7. The method of claim 6, further comprising controlling critical dimensions of features being etched by controlling a carbon to fluorine ratio during the chamber cleaning step.

8. The method of claim 1, wherein the chamber cleaning step is executed after completion of the first etching process, and wherein the second etching process is executed after completion of the chamber cleaning step.

9. The method of claim 1, wherein executing the second etching process includes maintaining plasma at a greater plasma pressure as compared to the first etching process.

10. The method of claim 1, wherein the steps of executing the first etching process, executing the chamber cleaning step, and executing the second etching process are cycled until a predetermined depth of the silicon-containing layer has been etched.

11. A method for processing a substrate, the method comprising:

positioning the substrate in a chamber of a plasma processing system, the substrate having a masking layer positioned over a germanium-containing layer, the masking layer defining openings less than 40 nanometers;

executing a first etching process that anisotropically etches a first portion of the germanium-containing layer until reaching one or more buried structures within the germanium-containing layer using the masking layer as an etch mask and using plasma formed from a first process gas that includes a bromine-containing gas or a chlorine-containing process gas;

executing a chamber cleaning step that includes removing chamber wall residue using plasma formed from a second process gas that includes a fluorine-containing process gas, the residue including products from the first etching process, the chamber cleaning step being executed while the substrate is positioned in the chamber of the plasma processing system; and executing a second etching process that anisotropically etches a second portion of the germanium-containing layer using the masking layer as the etch mask and using plasma formed from a third process gas that includes the bromine-containing gas or the chlorine-containing gas, wherein the first etching process and the second etching process create a space in the substrate having an aspect ratio value greater than 7.0 as calculated from a top of the masking layer to a bottom of the second portion of the germanium-containing layer.

12. The method of claim 11, wherein the one or more buried structures within the germanium-containing layer includes a fin of a FinFET structure.

13. The method of claim 12, wherein executing the second etching process that anisotropically etches the second portion of the germanium-containing layer includes etching a remaining portion of the germanium-containing layer until the remaining portion of the germanium-containing layer is removed from around the fin of the FinFET structure.

14. The method of claim 11, wherein executing the chamber cleaning step includes using the second process gas that includes an oxygen-containing gas.

15. The method of claim 14, wherein executing the chamber cleaning step includes forming an oxide layer on exposed vertical surfaces of the germanium-containing layer having been exposed from the first etching process.

16. The method of claim 11, wherein the steps of executing the first etching process, executing the chamber cleaning step, and executing the second etching process are cycled until a predetermined depth of the germanium-containing layer has been etched.

17. The method of claim 11, further comprising controlling critical dimensions of features being etched by controlling a carbon to fluorine ratio during the chamber cleaning step.

18. The method of claim of claim 11, wherein removing the chamber wall residue includes removing $Ge_xBr_yO_z$ or $Ge_xCl_yO_z$, wherein x and y are non-zero.

* * * * *